United States Patent [19]

Bayer

[11] Patent Number: 5,277,734
[45] Date of Patent: Jan. 11, 1994

[54] ELECTRICALLY CONDUCTIVE CIRCUIT SHEET AND METHOD AND APPARATUS FOR MAKING SAME

[75] Inventor: Alfred H. B. Bayer, Rosemére, Canada

[73] Assignee: Fred Bayer Holdings Inc., Rosemere, Canada

[21] Appl. No.: 788,928

[22] Filed: Nov. 7, 1991

[51] Int. Cl.⁵ .............................................. B32B 31/00
[52] U.S. Cl. ................................. 156/230; 156/235; 156/249; 156/344
[58] Field of Search ............... 156/230, 235, 238, 249, 156/344, 353

[56] References Cited

U.S. PATENT DOCUMENTS

| | | | |
|---|---|---|---|
| 3,279,969 | 10/1966 | Borchardt | 156/235 |
| 4,717,438 | 1/1988 | Benge et al. | 156/249 X |
| 4,869,767 | 9/1989 | Robinson et al. | 156/249 X |
| 5,017,257 | 5/1991 | Murphy | 156/353 X |

Primary Examiner—David A. Simmons
Assistant Examiner—James J. Engel, Jr.
Attorney, Agent, or Firm—Longacre & White

[57] ABSTRACT

A method and an apparatus for making a conductive circuit in sheet form. A circuit trace is firstly designed using a CAD (computer aided design) system and a computer aided cutting device is operated by the CAD to cut the desired circuit trace in a thin foil sheet which is adhesively secured to a release backing sheet. The non-circuit trace portions of the foil sheet are removed from the adhesive release backing sheet leaving only the circuit trace. An adhesive transfer sheet is then used to remove the actual circuit trace, in an undisturbed manner, from the release sheet and applied it to a support base. Because the circuit trace has an adhesive backing, it will adhere to the support base. A multi-layer flexible electric conductive circuit can also be fabricated with this method and the transfer sheet can also be utilized as an insulating layer.

4 Claims, 5 Drawing Sheets

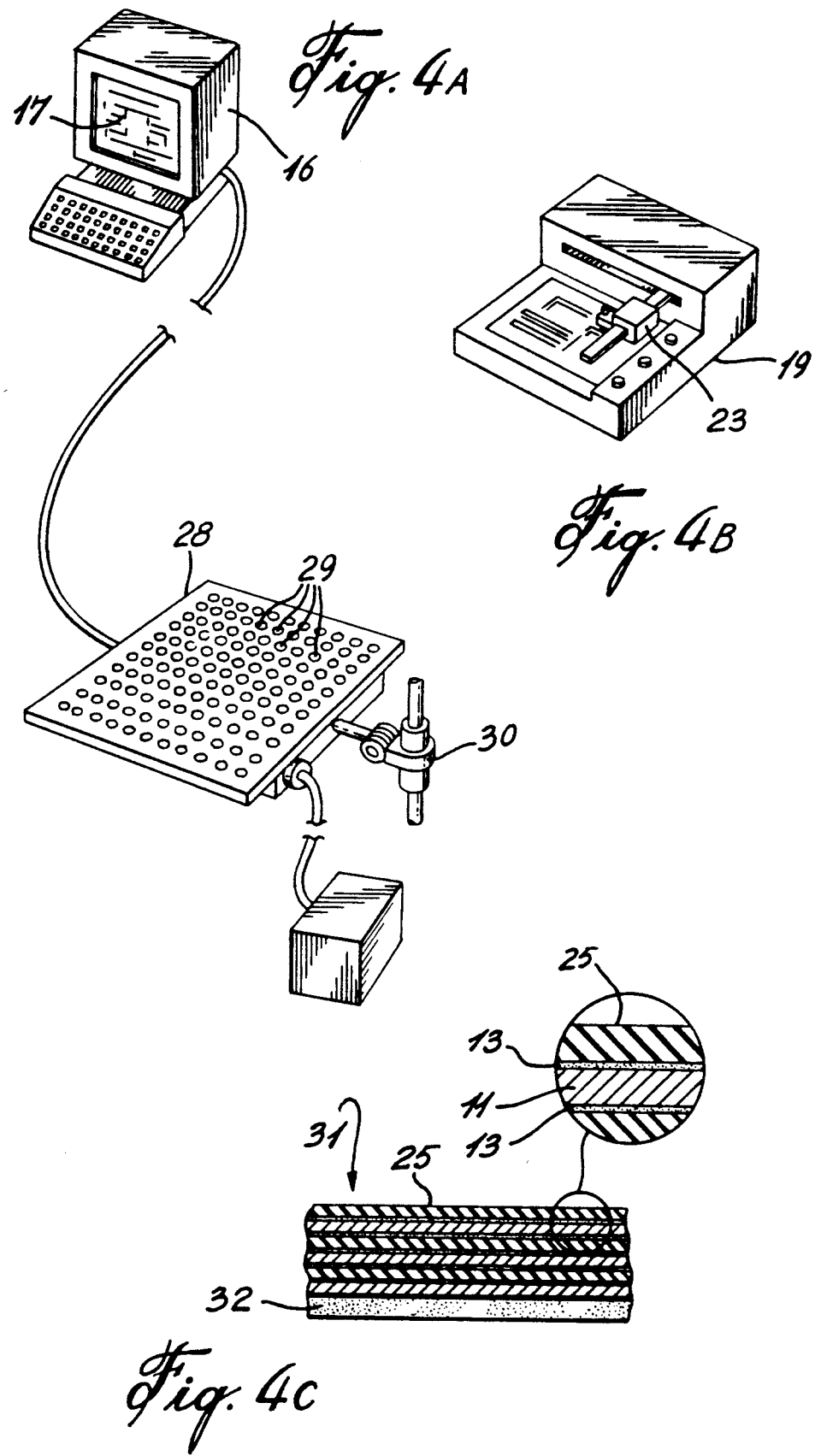

ELECTRICALLY CONDUCTIVE CIRCUIT SHEET AND METHOD AND APPARATUS FOR MAKING SAME

BACKGROUND OF INVENTION

1. Field of the Invention

The present invention relates to an electrically conductive thin metal foil circuit trace having an adhesive backing for securement to a base. The circuit trace is firstly supported on a release sheet and is transferred therefrom and onto the base by the use of an adhesive transfer sheet.

2. Description of Prior Art

Various types of printed circuits are known. For example, U.S. Pat. No. 4,799,984 describes a method of fabricating a multi-layer circuit on a rigid ceramic substrate. However, all of these methods utilize a printing process for forming the printed circuit and firing process to form thick film conductors and insulating dielectrics on rigid insulated substrate material, such as alumina. The printing is usually effected through a screen mesh. In the above-referred to U.S. Patent, there is described an improved method of fabricating multi-layer circuits but this method still utilizes a firing step and uses solid substrates. Reference is also made to U.S. Pat. No. 4,891,242 which teaches the use of an automatic apparatus in which an ink jet head is displaced on an X-Y axis of a computer-aided machine (CAD) to form a circuit pattern instead of using the usual screen mask of the prior art. This eliminates the use of many screen masks to form a printed circuit and also saves time in designing and manufacturing as compared to the screen mask techniques. Again, with this method, it is necessary to bake a solution into the substrate.

SUMMARY OF INVENTION

It is a feature of the present invention to provide a simple and novel method of producing single or multi-layer conductive circuits which are comprised of flat conductive traces formed from a thin foil sheet and adhered to a non-conductive support base.

Another feature of the present invention is to provide a novel method of making a conductive circuit comprised of flat conductive traces formed from a thin foil sheet and adhered to a non-conductive support base.

A still further feature of the present invention is to provide an apparatus for making a conductive circuit comprised of flat conductive circuit traces formed from a thin foil sheet and adhered to a non-conductive support base.

According to the above features, from a broad aspect, the present invention provides a method of making a conductive circuit comprised of flat conductive traces adhered to a non-conductive support base. The method consists of the steps of cutting a circuit trace or traces in a conductive sheet having an adhesive backing removably supported on a release backing sheet. Portions of the conductive sheet that are not part of the circuit traces are removed. Transfer means is applied on the circuit traces to remove the traces from the release backing sheet while maintaining the configuration of the circuit traces. The circuit traces are then transferred to a support base by positioning the transfer means with the adhesive backing of the circuit traces facing the support base. The transfer means is then removed after the circuit traces are adhesively secured to the support base.

According to a still further broad aspect of the present invention, there is provided an apparatus for making a conductive circuit which is comprised of flat conductive circuit traces adhered to a non-conductive support base. The apparatus comprises a computer having a display screen and a design program for producing desired circuit traces on the screen. A computer-aided cutting device is also provided and has a support surface on which is disposed a composite sheet comprised of a thin metal sheet having an adhesive backing and disposed on a release backing sheet. The cutting device is operable by the computer to cut the desired circuit traces in the thin metal sheet. Means is provided to remove non-circuit trace sheet portions from the thin metal sheet. Transfer means is also provided to pick up the cut circuit traces from the release backing sheet and apply same to a support base with the adhesive backing of the circuit traces facing the support base so that the circuit traces adhere to the base and maintain their original configuration.

According to a still further broad aspect of the present invention, there is provided a conductive circuit which is comprised of flat conductive circuit traces made of thin conductive sheet material having an adhesive backing and removably adhered to a release backing sheet. The circuit traces are conductive strips which are spaced from one another.

According to a still further broad aspect of the present invention, there is provided a conductive circuit which is comprised of a lamination of two or more flat conductive traces of thin conductive sheet material having an adhesive backing and adhered to a respective insulating sheet. The insulating sheets have an adhesive backing disposed over the conductive traces of an adjacent underlayer.

According to a further broad aspect of the present invention, the insulating sheets are adhesive transfer sheets utilized to transfer the traces from backing sheets without disturbing the configuration of the electric circuit traces.

BRIEF DESCRIPTION OF DRAWINGS

A preferred embodiment of the present invention will now be described with reference to the accompanying drawings in which:

FIGS. 4a, 4b and 4c are a schematic views illustrating the apparatus to carry out the method of manufacture of the present invention.

DESCRIPTION OF PREFERRED EMBODIMENTS

Figure 1A:
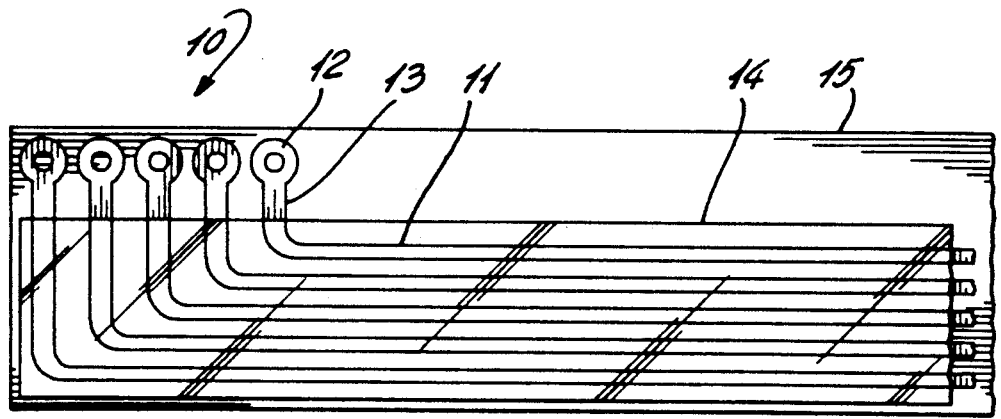
FIGS. 1a, 1b and 1c are plan views showing the formation of a multi-layer conductive circuit constructed in accordance with the present invention.
Figure 1B:
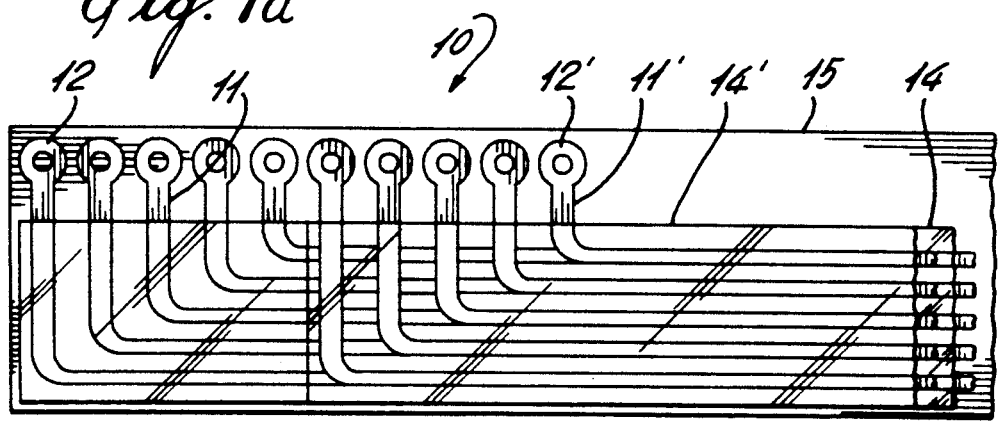
Figure 1C:
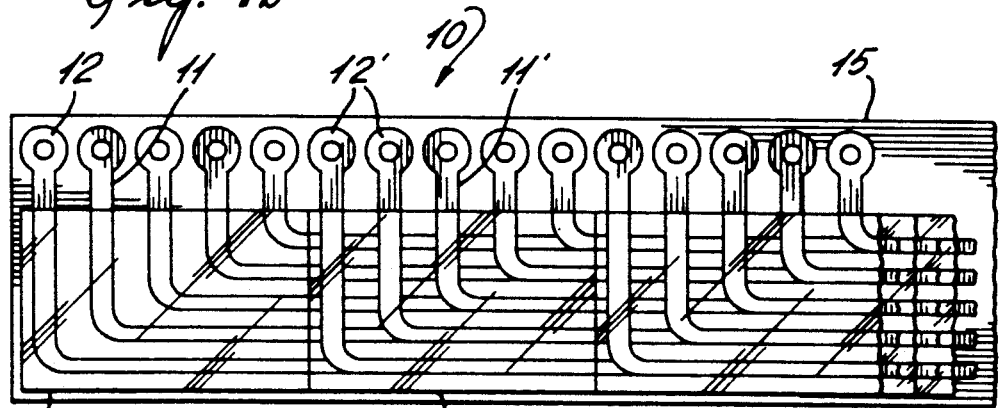

Referring now to the drawings, and more particularly to FIG. 1, there is shown generally at 10, a conductive circuit constructed in accordance with the present invention. The conductive circuit is comprised of flat conductive circuit traces or strips 11 which are made of thin conductive sheet material, herein thin conductive foil, such as 0.013 mm thick foil. These strips 11 are each provided with terminals 12 and have an adhesive backing surface 13 to adhesively retain same on an insulating base material 14. The strips may also have terminals 12 formed integrally therewith. The base material 14 is herein shown as a flexible thin plastic sheet. However, the base material could be any flexible or rigid flat surface, such as a circuit board, or the surface can also have a shape, such as the surface of a cylinder, etc.

As illustrated in FIG. 1, the conductive circuit is provided by a lamination of the circuit traces 11 and insulating base materials 14. The underlayer is signified by the prime reference numbers. As can be appreciated, using this invention, a very long strip of a multiplicity of conductive circuit sheets can be fabricated. The insulating base material 14 also has an adhesive surface to adhere to the underlying base material. The resulting multi-layer strip can also be conveniently secured by means of the adhesive backing of the base material with the bottom one of the base sheets 14 being releasably retained on a release sheet 15 which is removed prior to securing the strip.

Figure 2A:
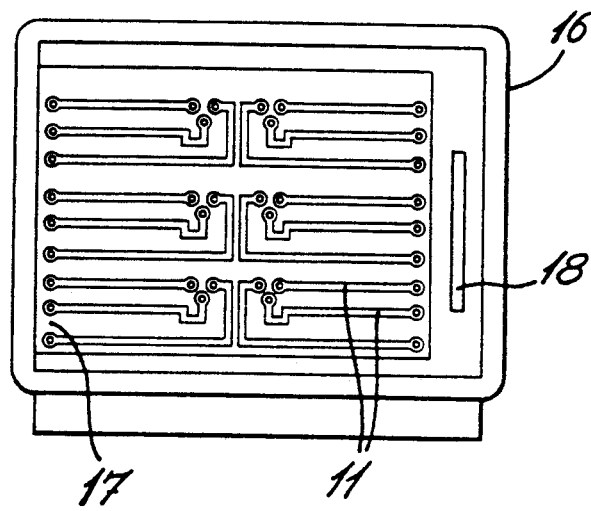
FIGS. 2a to 2f are schematic views illustrating the method of manufacturing a conductive circuit in accordance with the present invention.
Figure 2B:
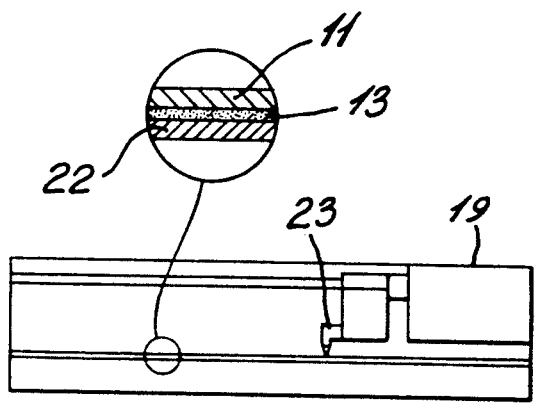
Figure 2C:
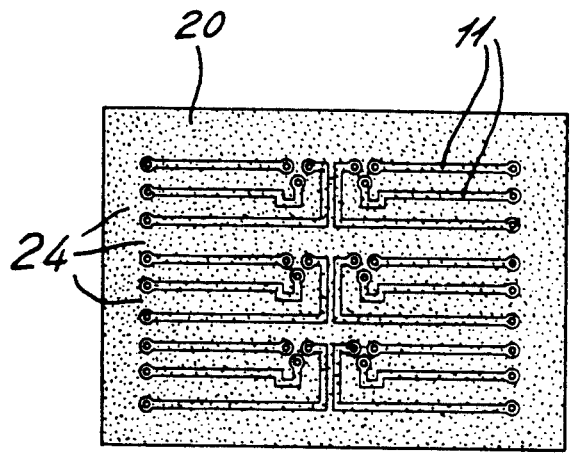
Figure 2D:
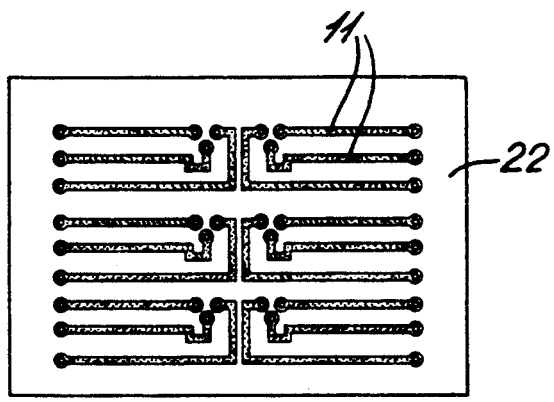
Figure 2E:
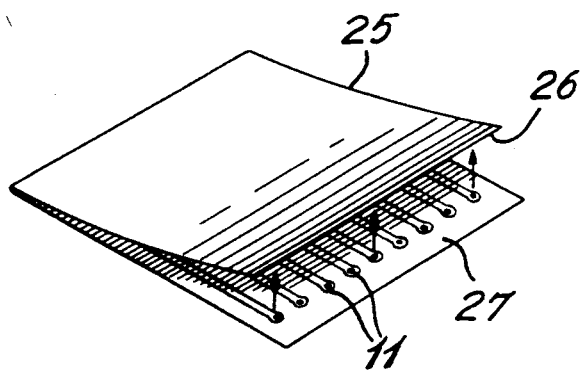
Figure 2F:
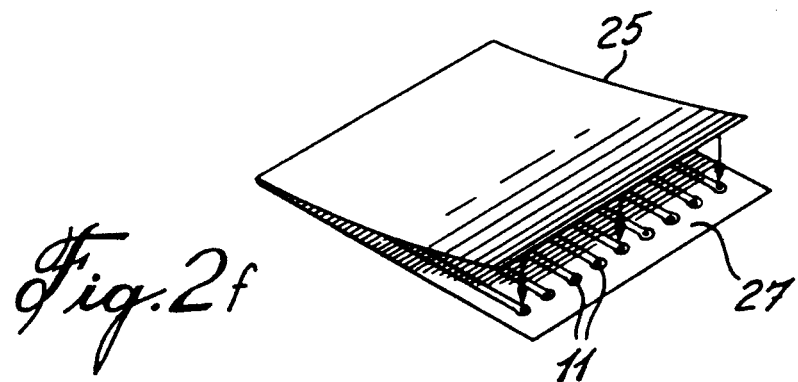

Referring now additionally to FIGS. 2a to 2f and FIG. 3, there will be described the method and apparatus for constructing the conductive circuit of the present invention. As shown in FIG. 2a, the method comprises firstly designing a circuit consisting of traces 11 on the computer screen 17 of a CAD computer system 16. Once the circuit traces 11 are designed, a computer-aided cutting device 19 is operated by the computer to cut the circuit traces 11 into a composite sheet 20 which is comprised of a thin metal foil sheet 21 having an adhesive backing 13 as previously described. This adhesive backing retains the foil sheet on the backing sheet 22. The cutting element 23 of the cutting device 19 follows the circuit path designed on the screen 17 of the computer 16 and cuts into the foil sheet to reproduce the circuit traces 11.

After the circuit traces are cut in the foil material 20 as shown in sequence (c) of FIG. 2, the portions 24 that are not part of the circuit traces are removed. This removal step can be done automatically or manually by the use of a knife, without disturbing the circuit traces 11. After this step is performed, the traces 11 are the only elements left on the release backing sheet 22.

A transfer sheet 25 having an adhesive backing surface 26 is then positioned over the release sheet 22 with the adhesive side 26 facing the circuit traces 11 whereby to adhere to the traces. Because the circuit traces are adhesively secured to a release surface of the backing sheet 22, the adhesive strength of the surface 26 of the transfer sheet will peel off the strips of circuit traces without disturbing their configuration and orientation. The transfer sheet 25 with the attached circuit trace 11 is then applied on a base material 27, as shown in step (f) of FIG. 2. The strength of the adhesive layer 13 on the back of the circuit traces 11 must be greater than the adhesive strength on the adhesive surface 26 of a transfer sheet so that when the transfer sheet is positioned over the base material 27, it can be peeled off with the conductive circuit traces remaining on the base material. Alternatively, after the sheet 25 has been placed on the base material 27, pressure can be applied on the outer surface of the transfer sheet 25 and over the conductive circuit traces 11 thereby to burnish the circuit traces onto the base material, much like the transfer of decals from a waxed support sheet.

It is also within the scope of the present invention to provide a transfer sheet which is made of an insulating plastics material and the transfer sheet can remain on the base material 27 acting both as the transfer sheet and as an insulation layer for the conductive layers of traces 11. This is particularly useful when making multi-layer conductive strip circuits, as described with reference to FIG. 1.

Figure 3:
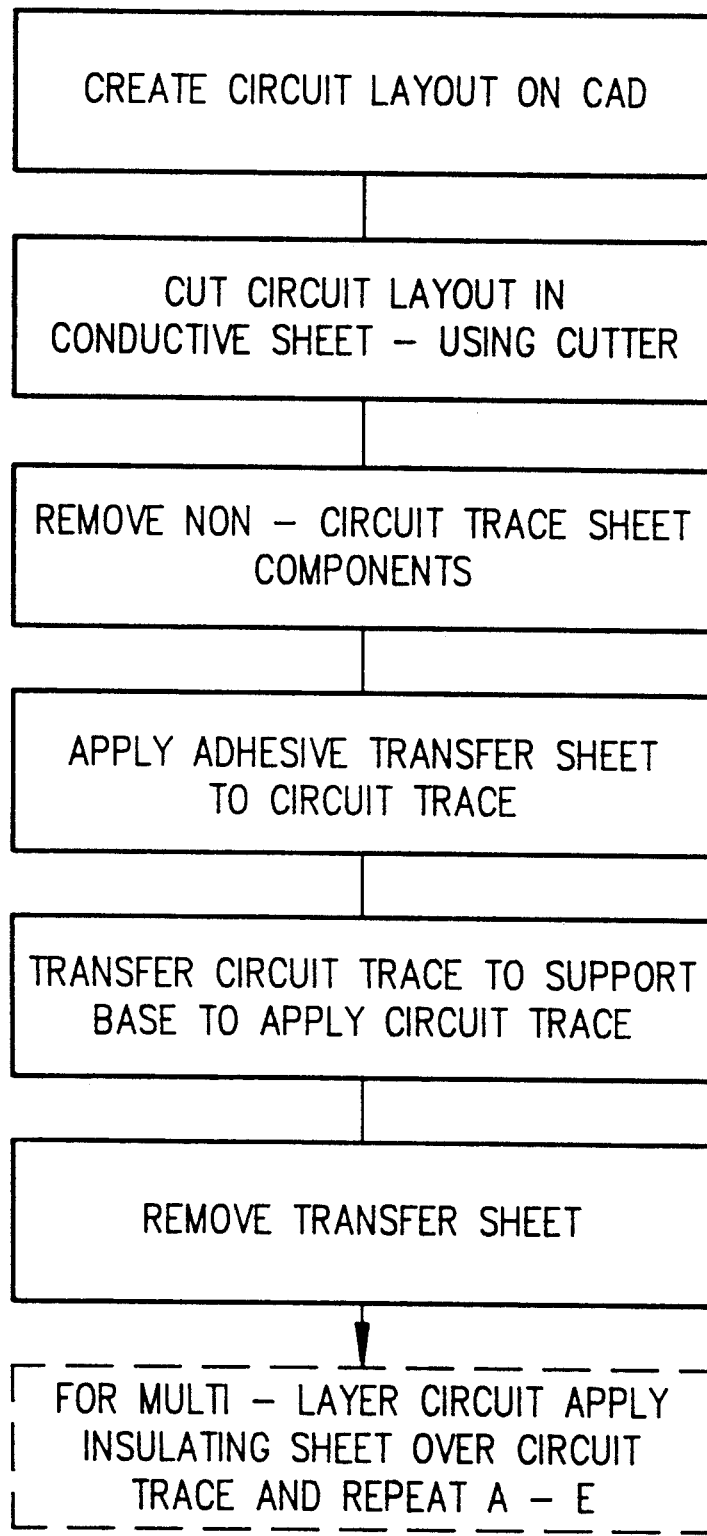
FIG. 3 is a flow chart illustrating the method of fabrication of a single or multi-layer conductive circuit in accordance with the present invention.

The process above-described can also be automated by using various off-the-shelf equipment modified to carry out the method of the present invention as shown in FIG. 3. Such apparatus is illustrated in FIG. 4. As herein shown, the computer 16 is a CAD system which drives the computer-aided cutting device 19. This cutting device is also available in the trade. The means to remove the non-circuit sheet components 24 from the thin metal sheet 20 can be effectuated by a vacuum stripper platform 28 which has a matrix of vacuum heads 29 on a transfer surface thereof and this can be mounted on a turret 30 for positioning the vacuum heads over the metal sheet 20 at a precise position so that only the vacuum heads over the areas to be removed are actuated by the computer 16 to lift the non-circuit foil sheet portions from the foil sheet 20. The release sheet 22 would, of course, be secured to the support surface of the cutting device 19 and this could also be done by providing a stronger suction force under the release sheet 22. The turret device 30 would then pivot to a discharging station where it would eject these cuttings and then go back to a pick-up station where an adhesive transfer sheet would be picked up and placed over the release sheet 22 having the conductive trace circuits 11 adhesively retained thereon. The transfer sheet would be positioned over the sheet 20 with the adhesive surface of the transfer sheet providing the pick-up of the circuit traces 11 only and in an undisturbed manner. The turret would then move to a forming station 31 where the transfer sheet would then deposit the conductive traces onto a support base, such as a plastic sheet or ceramic sheet 32, or on a further insulating layer or transfer sheet 25, if the transfer sheet is also used as the insulating layer, as previously described. Of course, many other modifications of this type of apparatus are possible to carry out the method of the present invention.

With reference to FIG. 3, the method of the present invention will now be summarized. Firstly, a circuit layout is created on a CAD computer device. The created circuit is then cut in a conductive foil using a cutting device and the non-circuit trace sheet components of the conductive sheet are removed. This removal can be done by the use of automatic equipment or manually by the use of a cutting implement. An adhesive transfer sheet is then applied over the circuit trace so as to cause the circuit trace to adhere to the adhesive transfer sheet. This can be done manually or by automatic equipment as above-described. The transfer sheet is then positioned on a support base so that the adhesive backing of the conductive circuit traces are adhered to the support base. This adherence can be effectuated by having adhesives on the back of the circuit traces weaker than the adhesive on the back of the transfer sheet or else by burnishing the circuit traces onto the support base. Alternatively, as above-described, the transfer sheet can also be utilized as an insulating sheet and utilized for insulating different conductive layers when constructing a multi-layer conductive circuit.

It is also within the ambit of the present invention to provide a conductive circuit which is comprised of flat conductive circuit traces made of thin conductive sheet material which have an adhesive backing and which are removably adhered to a release backing sheet. Such circuits would have use to hobbyist or can provide a means to construct prototype circuits by simply peeling circuit strips from the release sheet and sticking the circuit strips on any electrically insulated surface. The conductive circuit of the present invention has particularly feasible applications for low voltage wiring runs particularly where space, weight and cost are important factors. Also, because the conductive circuit traces have an adhesive backing, they can be attached to almost any material or any objects of irregular shape. The flexible and multi-layer adhesive conductive circuit strips can also be utilized in difficult to wire areas or may even be positioned in a non-conductive plastic shield to serve as conductors such as with the automotive trade, where they are utilized in dashboards or anywhere where it would be costly to consider the use of conventional printed circuit boards or multi-conductor wiring.

It is within the ambit of the present invention to cover any other obvious modifications not mentioned herein, provided such modifications fall within the scope of the appended claims.

I claim:

1. A method of making flat conductive circuit traces for adherence to a non-conductive support base, said method comprising the steps of:
   (i) placing a composite sheet, having a thin metal sheet with an adhesive backing disposed on a release backing sheet, over a cutting area,
   (ii) cutting a circuit trace or traces in said conductive sheet having said adhesive backing without cutting said release backing sheet,
   (iii) removing portions of said conductive sheet that are not part of said circuit traces from said release backing sheet,
   (iv) applying an adhesive transfer sheet having an adhesive surface on said circuit traces to remove said circuit traces from said release backing sheet while maintaining the configuration of said circuit traces, said adhesive surface being applied directly on said circuit traces to effect the removal thereof from said release backing sheet,
   (v) transferring said circuit traces to said support base by manually positioning said transfer sheet at a desired location on said support base with said adhesive backing of said circuit traces facing said support base, said adhesive backing of said conductive sheet having a higher adhesive strength than said adhesive surface of said transfer sheet, and
   (vi) removing said adhesive transfer sheet without disturbing said traces after said circuit traces are adhesively secured to said support base due to said higher adhesive strength of said adhesive on said circuit traces.

2. A method as claimed in claim 1 wherein said step (vi) further comprises applying localized pressure over said transfer sheet in the areas of said circuit traces to adhesively bond said circuit traces to said support base, and peeling off said transfer sheet from said support base with said circuit trace remaining on said base.

3. A method as claimed in claim 1 wherein there is further provided the steps of (vii) applying a second support sheet over said circuit traces adhesively secured to said support base, and (viii) transferring further circuit traces over said second support sheet and insulated from said circuit traces.

4. A method as claimed in claim 3 wherein said support base and said second support sheet are thin, flexible, non-conductive sheets, said method comprising transferring a plurality of circuit traces on a respective one of a plurality of superimposed support sheets to construct a multi-layer conductive circuit.

* * * * *